(12) United States Patent
Hammerschmidt

(10) Patent No.: US 9,692,623 B2
(45) Date of Patent: Jun. 27, 2017

(54) RECEIVER, TRANSMITTER, METHOD FOR DETERMINING A VALUE ENCODED IN A PWM SIGNAL, AND METHOD FOR TRANSMITTING A VALUE ENCODED IN A PWM SIGNAL

(71) Applicant: Infineon Technologies AG, Neubiberg (DE)

(72) Inventor: Dirk Hammerschmidt, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/933,283

(22) Filed: Nov. 5, 2015

(65) Prior Publication Data

US 2016/0142071 A1    May 19, 2016

(30) Foreign Application Priority Data

Nov. 19, 2014   (DE) .......................... 10 2014 116 906

(51) Int. Cl.
| | | |
|---|---|---|
| *H04L 25/493* | (2006.01) | |
| *H03M 5/08* | (2006.01) | |
| *H03K 9/10* | (2006.01) | |
| *H03M 1/82* | (2006.01) | |
| *H04L 25/49* | (2006.01) | |

(Continued)

(52) U.S. Cl.
CPC ........... *H04L 25/4902* (2013.01); *H03K 7/08* (2013.01); *H03K 9/10* (2013.01); *H03M 1/822* (2013.01); *H03M 5/08* (2013.01); *H04L 25/493* (2013.01); *H04L 25/4917* (2013.01); *H04L 25/4927* (2013.01); *H04L 2025/03363* (2013.01)

(58) Field of Classification Search
CPC ............. H04L 25/4902; H04L 25/4917; H04L 25/493; H04L 2025/03363; H04L 25/4927; H03K 7/08; H03K 9/08; H03K 9/10; H03M 1/822; H03M 5/08
See application file for complete search history.

(56) References Cited

U.S. PATENT DOCUMENTS

| | | | |
|---|---|---|---|
| 7,221,295 B2 * | 5/2007 | Carley ..................... | H03M 5/08 341/100 |
| 2004/0223545 A1 * | 11/2004 | Lee ........................ | H03M 3/506 375/238 |

(Continued)

OTHER PUBLICATIONS

Kramolis, Josef. "SENT/SPC Driver for the MPC5510 Microcontroller Family." Freescale Semionductor, Inc. Oct. 2010.

*Primary Examiner* — Michelle M Koeth
(74) *Attorney, Agent, or Firm* — Eschweiler & Potashnik, LLC

(57) ABSTRACT

A receiver includes a receiver circuit to receive a pulse width modulated signal, which assumes a first signal level, a second signal level and an intermediate signal level between the first signal level and the second signal level. The receiver further includes a quantization circuit to determine a value encoded in the signal based on an intermediate time period between a first transition and an intermediate transition and based on a main time period between the first transition and a second transition. The first transition comprises the first signal level, wherein the intermediate transition includes the intermediate signal level. The second transition includes the second signal level.

16 Claims, 6 Drawing Sheets

(51) Int. Cl.
*H03K 7/08* (2006.01)
*H04L 25/03* (2006.01)

(56) References Cited

U.S. PATENT DOCUMENTS

| | | | | |
|---|---|---|---|---|
| 2011/0310954 A1* | 12/2011 | Sawaoka | ............... | H03K 7/08 |
| | | | | 375/238 |
| 2012/0114033 A1* | 5/2012 | Chen | ............... | G10K 11/1782 |
| | | | | 375/238 |
| 2014/0214970 A1* | 7/2014 | Rasbornig | ............... | H04L 51/30 |
| | | | | 709/206 |

* cited by examiner

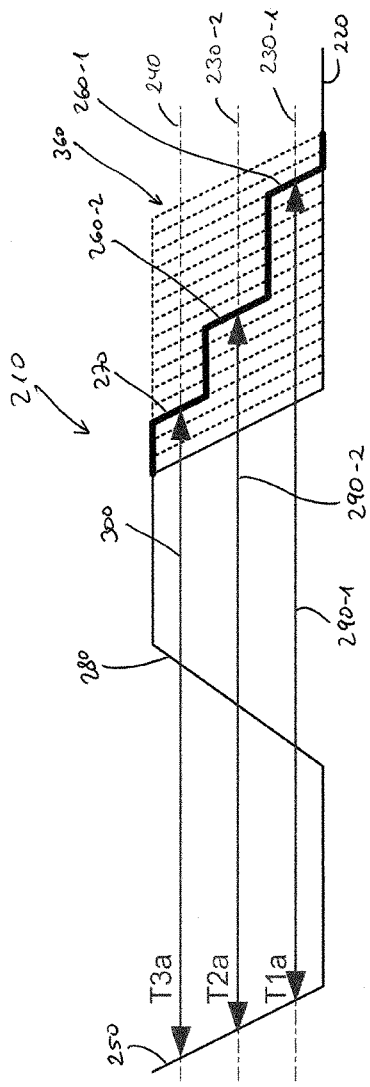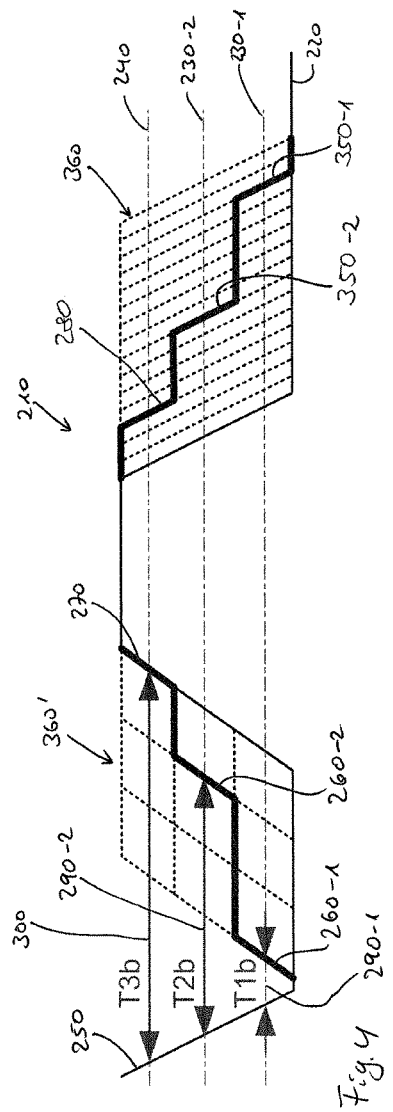

RECEIVER, TRANSMITTER, METHOD FOR DETERMINING A VALUE ENCODED IN A PWM SIGNAL, AND METHOD FOR TRANSMITTING A VALUE ENCODED IN A PWM SIGNAL

CROSS REFERENCE TO RELATED APPLICATION

This application claims priority to German Application No. 10 2014 116 906.9, filed on Nov. 19, 2014, and incorporated herein by reference in its entirety.

FIELD

Embodiments relate to a receiver, a transmitter, a method for determining a value encoded in a pulse width modulated (PWM) signal, a method for transmitting a value encoded in pulse width modulated signal, and corresponding computer, processor and programmable hardware-related implementations.

BACKGROUND

In many fields of technology, data are transmitted from one entity to another entity using a digital encoding scheme. While in some of these applications highly sophisticated transmission schemes are employed, in many fields a tendency exists to use a less complex digital transmission scheme yet allowing receiving and/or transmitting data robustly at a sufficiently high rate allowing a simple implementation. In other words, the tendency exists to improve a trade-off between robustness of transmitting and/or receiving data with respect to distortions, simplicity of implementation and a high data rate.

For instance, in the field of high volume architectures using low cost implementations, finding a solution for this trade-off may be more relevant than in other technological fields. For instance, in the field of communication systems for motorized or non-motorized vehicles, different components including sensors, control units and other devices often require a communication architecture allowing a transmission or even an exchange of data, which is robust against distortions even under tough operating conditions. Nevertheless, such an architecture should provide enough bandwidth to allow different entities to transmit data. Due to the high volume of these components used even in a single vehicle, a simple and hence cost-efficient implementation may become relevant. For instance, in the automotive sector sensors, control units and other devices may need to communicate with one another.

However, also in other fields of technology a comparable demand exists including also non-high volume architectures and systems.

SUMMARY

Therefore, a demand exists to improve a trade-off between robustness of a signal transmission, simplifying a corresponding implementation and an available data rate for such a communication system.

A receiver according to an embodiment comprises a receiver circuit to receive a pulse width modulated signal, which assumes at least a first signal level, a second signal level and an intermediate signal level between the first signal level and the second signal level. The receiver further comprises a quantization circuit to determine a value encoded in the signal based on an intermediate time period between a first transition and an intermediate transition and based on a main time period between the first transition and a second transition. The first transition comprises the first signal level, wherein the intermediate transition comprises the intermediate signal level. The second transition comprises the second signal level. Optionally, the intermediate transition may be located between the first transition and the second transition or the second transition may be located between the first transition and the intermediate transition.

A transmitter comprises a quantization circuit to determine, based on a value to be encoded in a pulse width modulated signal, an intermediate time period between a first transition and an intermediate transition and a main time period between the first transition and a second transition. The transmitter further comprises a transmitter circuit to generate the pulse width modulated signal, which assumes at least a first signal level, a second signal level and an intermediate signal level between the first signal level and the second signal level. The first transition comprises the first signal level, wherein the intermediate transition comprises the intermediate signal level. The second transition comprises the second signal level. Optionally, the intermediate transition may be located between the first transition and the second transition or the second transition may be located between the first transition and the intermediate transition.

BRIEF DESCRIPTION OF THE DRAWINGS

Several embodiments of the present disclosure will be described in the enclosed Figures.

FIG. 3 shows a further signal generated by transmitter according to an embodiment and processable by a receiver according to an embodiment;

FIG. 4 shows another signal generated by transmitter according to an embodiment and processable by a receiver according to an embodiment;

DETAILED DESCRIPTION

Figure 1:
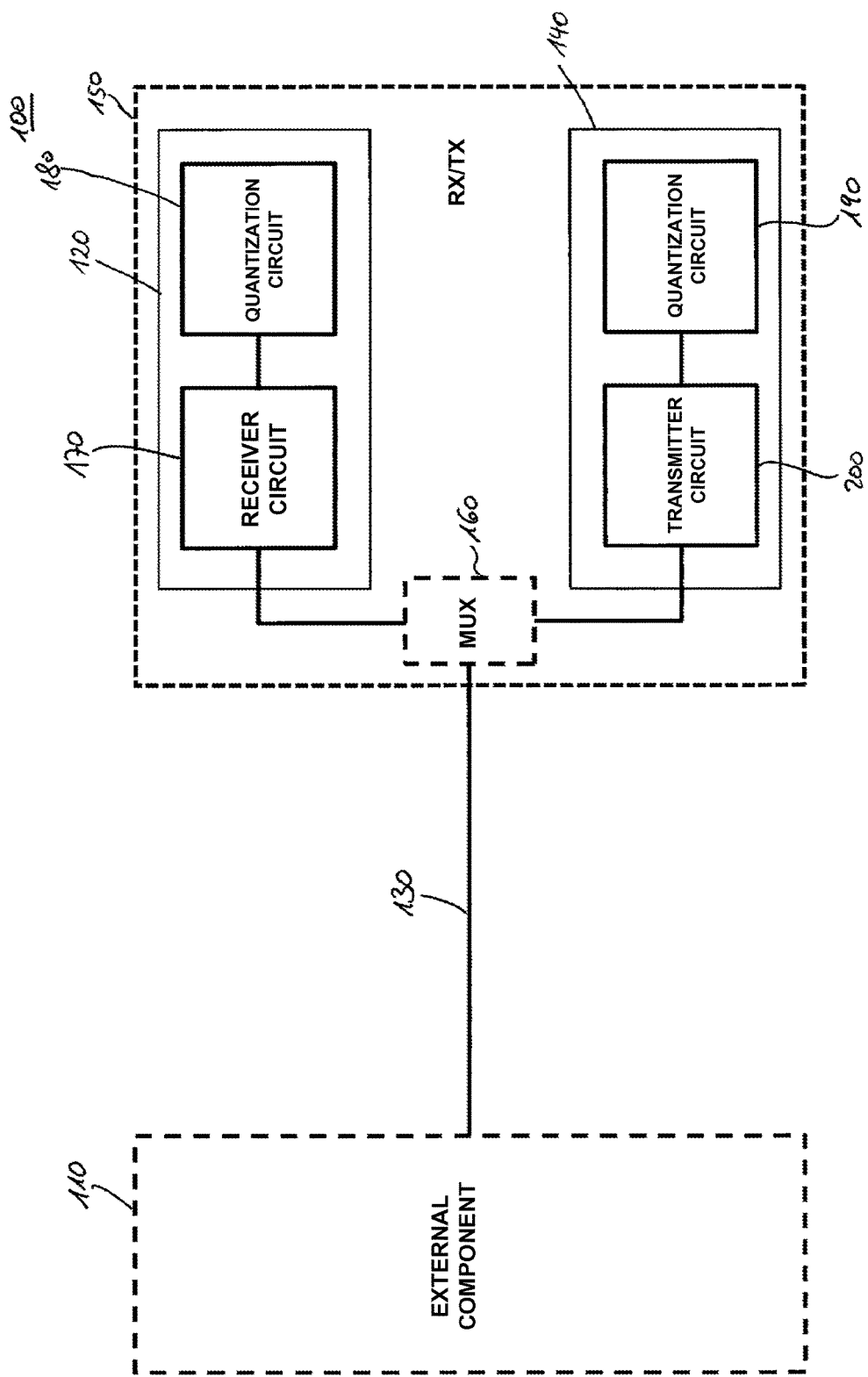
FIG. 1 shows a simplified block diagram of a communication system according to an embodiment comprising a transceiver according to an embodiment, which comprises a transmitter and a receiver according to embodiments.

In the following, embodiments according to the present disclosure will be described in more detail. In this context, summarizing reference signs will be used to describe several objects simultaneously or to describe common features, dimensions, characteristics, or the like of these objects. The summarizing reference signs are based on their individual reference signs. Moreover, objects appearing in several embodiments or several figures, but which are identical or at least similar in terms of at least some of their functions or structural features, will be denoted with the same or similar reference signs. To avoid unnecessary repetitions, parts of the description referring to such objects also relate to the corresponding objects of the different embodiments or the different figures, unless explicitly or—taking the context of the description and the figures into account—implicitly stated otherwise. Therefore, similar or related objects may be implemented with at least some identical or similar features, dimensions, and characteristics, but may be also implemented with differing properties.

In many fields of technology, a demand exists to allow components of a system to transmit data from one component to another using a digital transmission scheme. Sometimes, the communication is not uni-directional, but a bi-directional communication allowing an exchange of data, commands, status information or the like. In the following description information to be transmitted from one component or entity to another component or entity will be referred to as data and values irrespective of the content or the meaning of the respective pieces of information.

In these applications often very different design goals have to be taken into consideration. However, in many cases, a robust transmission of data with respect to distortions, a simple implementation along with a high throughput of data represent important design goals. As a consequence, in many fields of applications a demand exists to improve a trade-off between these parameters.

Examples come, for instance, from high volume and/or low cost implementations, in which technically simple and, hence, cost efficient solutions may be important. For instance, in the field of components for an intra-vehicle communication, the individual components are often subjected to significant distortions while operating under difficult environmental influences. For instance, electromagnetic bursts may couple into electrical or electronic communication systems caused, for instance, by ignition systems, power control systems or the like.

However, even under these more difficult operational conditions, the components are often required to operate reliably and to be able to transmit and/or receive data with a sufficient high throughput rate to allow the individual components to operate properly and within their specified parameters. This may be important, as, for instance, safety-related system and components having a direct influence on the safety of the passengers of a vehicle may be involved.

An example comes, for instance, from the field of sensors and other electronic components of a motorized or non-motorized vehicle communicating with one another over the corresponding electrical network or bus system of the vehicle. Due to the number of different sensors comprised in a car, a motorcycle or a similar vehicle, the sensors and control units as well as other components are subjected to a corresponding cost pressure, favoring technically more simple solutions. Moreover, a simple solution may be more robust against distortions compared to more sophisticated protocols and implementations.

However, to limit the number of bus systems or communication systems in such a vehicle, the corresponding bandwidth or throughput concerning data to be transmitted via the communication system should be sufficiently high to prevent the need to establishing different communication systems. This may allow even to reduce the number of communication systems in such a vehicle.

Although in the example outlined above, a vehicle-related application scenario has been described, also in other fields of technology similar problems exist leading to similar demands. Without the loss of generality, in the following reference will be made to a vehicle-related application of a communication protocol and its associated infrastructure allowing, for instance, a sensor or another component of a car to communicate with a control unit or a similar other component.

In the following the communication protocol described may be implemented as an electrical communication protocol based on, for instance, an electrical voltage and/or an electrical current being modulated or changed to transmit the data. To be a little more specific, in the protocols described a value is transmitted or received, which may comprise in principle any number of different states. However, in the following a bit-based transmission protocol will be described in more detail, in which a value may comprise a specified number of bits, which translates into a corresponding number of different states. For instance, in the case of a nibble comprising 4 bits, 16 ($=2^4$) different states may be transmitted. However, the number of bits may be different in other embodiments. Moreover, it is by far not required to implement a bit-based transmission scheme. In principle, any number of states instead of a power of 2 ($2^n$, n being an integer) may be used.

Examples of corresponding protocols comprise, for instance, SPC (Short PWM Codes or SENT single-edge nibble transmission). Both of these protocols are based on a pulse width modulation (PWM) encoding scheme for the transmission of nibbles or multiples of nibbles, wherein each of the nibbles comprises four bits. In these examples the valuation is based only on falling edges. Although these protocols are comparably robust with respect to distortions, an achievable data rate is limited in the case of both protocols. Both protocols use, however, a quite long period in the nibble header, which is not used for data transmission. As will laid-out in more detail below, the initial phase of the nibble may be used, for instance, to increase the transmission rate.

Although in the basic protocols mentioned mainly falling edges of the signal are used, in other embodiments also rising edges or a combination of both may be used to transmit or to receive a value. When in the following examples of the protocols a transition along a specific direction will be described, in a different embodiment the corresponding transition may have the opposite direction. When, for instance, in the following description the first transition is shown as a falling transition or edge, in another embodiment the first transition may be a rising transition or a rising edge. In the case of a SPC implementation or a SENT implementation, the first transition may be a falling edge, while a transition with the opposite direction may be a rising edge. As mentioned, in other embodiments the roles of falling and arising edges may be exchanged.

As will be outlined below, instead of an electric or electronic transmission scheme also other transmission schemes including, for instance, optical transmission schemes and magnetic transmission schemes may be used.

A receiver according to an embodiment comprises a receiver circuit to receive a pulse width modulated signal, which assumes at least a first signal level, a second signal level and an intermediate signal level between the first signal level and the second signal level. The receiver further comprises a quantization circuit to determine a value encoded in the signal based on an intermediate time period between a first transition and an intermediate transition and based on a main time period between the first transition and a second transition. The first transition comprises the first signal level, wherein the intermediate transition comprises the intermediate signal level. The second transition comprises the second signal level. Optionally, the intermediate transition may be located between the first transition and the second transition or the second transition may be located between the first transition and the intermediate transition.

A transmitter comprises a quantization circuit to determine, based on a value to be encoded in a pulse width modulated signal, an intermediate time period between a first transition and an intermediate transition and a main time period between the first transition and a second transition. The transmitter further comprises a transmitter circuit to generate the pulse width modulated signal, which assumes at least a first signal level, a second signal level and an intermediate signal level between the first signal level and the second signal level. The first transition comprises the first signal level, wherein the intermediate transition comprises the intermediate signal level. The second transition comprises the second signal level. Optionally, the intermediate transition may be located between the first transition and the second transition or the second transition may be located between the first transition and the intermediate transition.

A method for determining a value encoded in a pulse width modulated signal comprises receiving the pulse width modulated signal, which assumes at least a first signal level, a second signal level and an intermediate signal level between the first signal level and the second signal level, and determining the value encoded in the signal based on an intermediate time period between a first transition and an intermediate transition and based on a main time period between the first transition and a second transition. The first transition comprises the first signal level, wherein the intermediate transition comprises the intermediate signal level. The second transition comprises the second signal level. Optionally, the intermediate transition may be located between the first transition and the second transition or the second transition may be located between the first transition and the intermediate transition.

A method according to an embodiment for transmitting a value encoded in a pulse width modulated signal comprises determining, based on the value to be encoded in the pulse width modulated signal, an intermediate time period between a first transition and an intermediate transition and a main time period between the first transition and a second transition. The method further comprises generating the pulse width modulated signal, which assumes at least a first signal level, a second signal level and an intermediate signal level between the first signal level and the second signal level. The first transition comprises the first signal level, wherein the intermediate transition comprises the intermediate signal level. The second transition comprises the second signal level. Optionally, the intermediate transition may be located between the first transition and the second transition or the second transition may be located between the first transition and the intermediate transition.

By employing one or more intermediate signal levels and a corresponding number of intermediate transitions, it may be possible to increase the amount of data transmittable in a single pulse of the pulse width modulated signal. By adding an intermediate signal level and the corresponding intermediate transition, it may be possible to use a more complex shape of the pulse to transport more data and, thereby, increasing the available data rate. By employing a pulse width modulated (PWM) signal it may still be possible to maintain a high level of robustness against distortions when operating a such communication system in a disturbance-prone environment and to keep the implementation of such a communication system comparably simple. It may therefore be possible to improve the previously-mentioned trade-off between the robustness of a signal transmission, simplifying a corresponding implementation and the available data rate for such a communication system comprising, for instance, at least a transmitter, a receiver or any component implementing a method according to an embodiment.

With respect to a single pulse of the pulse width modulated signal, the transitions mentioned as well as the signal levels mentioned may be different from one another. For instance, the first signal level and the second signal level as well as the intermediate signal level may be different from one another. Similarly, the first transition, the second transition and the intermediate transition may be different from one another as well. The term "between" used does not typically include the border values, signal levels or transitions. For instance, the at least one intermediate signal level in between the first and second signal levels is typically neither identical to the first signal level nor to the second signal level. Similarly, the intermediate transition located in between the first transition and the second transition typically does not coincide with neither the first nor second transition. In embodiments, the signal may comprise one or more intermediate signal levels as well as one or more intermediate transitions. Hence, the signal comprising or assuming an intermediate signal level comprises the possibility of assuming a plurality of different intermediate signal levels. Similarly, the signal comprising an intermediate transition may comprise the possibility of comprising a plurality of different intermediate transitions. Moreover, the intermediate transition may be arranged between the first transition and the second transition or the second transition may be arranged between the first transition and the intermediate transition, to name just two examples.

The signal comprises, as described above, a signal level equal to or along a direction of a transition beyond a predefined signal level for a specified duration. For instance, the signal comprises a signal level equal to or along a direction of the intermediate transition beyond the intermediate signal level for an intermediate duration. Depending on the direction of the transition, the signal may comprise a signal level equal to the specified signal level or any signal level being higher or lower than the specified signal level, when the transition corresponds to a rising edge or a falling edge, respectively. In other words, when the respective transition corresponds to a rising edge, a signal level along a direction of the respective transition beyond that signal level may comprise any signal level higher than the respective signal level. In the case of the transition corresponding to a falling edge, the respective signal along a direction of the transition beyond the respective signal level corresponds to any signal level being smaller than the reference signal level.

Optionally, in a receiver according to an embodiment, the quantization circuit may be configured to determine the value based on the second transition and the intermediate transition having the same direction. This may allow simplifying an implementation of a quantization circuit by limiting deviations of a shape of the pulse of the pulse width modulated signal. It may also allow simplifying the implementation of the quantization circuit. Additionally or alternatively, it may be possible to maintain or even increase the robustness of the transmission and the reception quality even under disturbance-prone operational conditions by maintaining pulse shape.

Optionally, in such a receiver according to an embodiment, the quantization circuit may be configured to determine the value based on the first transition and the second transition having the same direction. By implementing the quantization circuit such that the first, the second and the intermediate transition have the same direction, it may be possible to increase the available bandwidth or the amount of data to be transmitted per pulse. Since the respective transitions are all having the same direction, variations depending on the direction of the transitions (falling times or rising times) of the signal may be of less importance. As a consequence, it may be possible to determine the positions of the transitions and, hence, the time periods or durations more accurately allowing more values to be encoded in the signal.

Alternatively, in such a receiver, the quantization circuit may be configured to determine the value based on the first transition and the second transition having opposite directions. In other words, the second transition and the intermediate transition may have the same direction, while the first transition has the opposite direction compared to the previously-mentioned transitions. This may allow increasing the available bandwidth by beginning the transmission of the value in a section of a pulse, which may be unused. In this section, the signal may assume the intermediate signal level between the first and second signal levels.

Additionally or alternatively, in a receiver according to an embodiment, the quantization circuit may be configured to determine the value based on the signal being monotone after the first transition until an end of the second transition. In other words, the intermediate transition may be part of the pulse such that the at least one intermediate transition and the second transition together form a monotone transition from the first signal level beyond the second signal level. This may also improve the previously-mentioned trade-off by maintaining the pulse-shape of the signal allowing to use a comparably simple implementation of the receiver and/or to maintain or even increase a robustness of the signal transition.

Additionally or alternatively, in a receiver according to an embodiment, the quantization circuit may be configured to determine the value based on the intermediate transition further comprising the first signal level. Additionally or alternatively, in a receiver according to an embodiment, the quantization circuit may be configured to determine the value based on the first transition further comprising the second signal level.

Additionally or alternatively, in a receiver according to an embodiment, the quantization circuit may be configured to determine the main time period based on the signal crossing the second signal level and the intermediate time period based on the signal crossing the intermediate signal level. In other words, the quantization circuit may be configured to determine the value based on the signal crossing the respective signal levels during the transitions. This may allow simplifying the quantization circuit by allowing the quantization circuit to determine a moment in time more accurately, when the signal crosses the respective signal level during the respective transition.

As will be outlined in more detail below, also detecting the main duration as well as the intermediate duration may be implemented similarly. For instance, a main duration may be determined based on the signal crossing the second signal level. Similarly, an intermediate duration may be determined based on the signal crossing the intermediate signal level.

Additionally or alternatively, in a receiver according to an embodiment, the quantization circuit may be configured to determine the value based on the main time period and the intermediate time period using a quantization function, wherein the quantization function is based on a set of discrete time intervals, wherein the smallest time interval with respect to the intermediate time period of the set of discrete time intervals is larger than a maximum mismatch of the intermediate transition with respect to the first transition, and wherein the smallest time interval with respect to the main time period of the set of discrete time intervals is larger than a maximum mismatch of the second transition with respect to the first transition. This may allow the receiver to determine the value more reliably, even when the transitions mentioned deviate from their expected positions. The mismatches may be, for instance, deviations of the respective transitions with respect to the possible positions of the first transition. The maximum mismatch may be, for instance, defined in a predefined specification the transmitter complies with.

Additionally or alternatively, in a receiver according to an embodiment, the quantization circuit may be configured to determine the value based at least on the main time period and the intermediate time period using a quantization function, wherein the quantization function is based on a set of discrete time intervals, and wherein the smallest time interval is larger than the length of the first transition, the second transition and the intermediate transition. This may allow determining the time periods as well as the durations more accurately, which may help to increase the available bandwidth even further. Additionally or alternatively, it may be possible to increase the robustness of the signal transmission.

Additionally or alternatively, in a receiver according to an embodiment, the quantization circuit may be configured to determine the value based on the intermediate time period only, when the signal is constant at the intermediate signal level or at a signal level between the intermediate signal level and the signal level for at least a predetermined period of time immediately after the intermediate transition. This may allow improving the previously-mentioned trade-off by maintaining the pulse-shape of the signal. This may allow simplifying the implementation of the quantization circuit and/or to maintain or even increase the robustness of the signal transmission.

Optionally, in such a receiver according to an embodiment, the quantization circuit may be configured to determine the value based at least on the main time period and the intermediate time period using the quantization function described above, such that the predetermined period of time may correspond to at least the smallest time interval of the quantization function. This may allow a more reliable and, hence, more robust transmission of the signal since the predetermined period corresponds to a reliably detectable interval.

Additionally or alternatively, in a receiver according to an embodiment the receiver circuit may be configured to receive the pulse width modulated signal assuming a plurality of intermediate signal levels between the first signal level and the second signal level, the plurality of intermediate signal levels comprising the intermediate signal level. The quantization circuit may be configured to determine the value encoded in the signal based on the main time period and based on a plurality of intermediate time periods between the first transition and one intermediate transition of the plurality of intermediate transitions. Each of the intermediate transitions may comprise a different intermediate signal level of a plurality of intermediate signal levels, wherein the intermediate transitions are located between the first signal level and the second signal level. By using a plurality of intermediate signal levels and a corresponding number of intermediate transitions it may be possible to increase the bandwidth further by allowing the signal to assume different intermediate signal levels so that the quantization circuit can evaluate the positions of the intermediate transitions.

Optionally, the previously mentioned features may also hold true for some or even all of intermediate transitions and/or intermediate signal levels. For instance, the plurality of intermediate transitions may all have the same direction, which may, for instance, coincide with that of the second transition.

Additionally or alternatively, in a receiver according to an embodiment, the quantization circuit may be configured to determine the value encoded in the signal further based on a further intermediate time period between the first transition and a third transition and based on a further main time period between the first transition and a further intermediate transition. The third transition may comprise the intermediate signal level, wherein the further intermediate transition comprises the intermediate signal level. The further intermediate transition may be located between the second transition and the third transition. This may allow to even further increase the throughput of data by not only changing the shape of the pulse with respect to the second transition, but also with respect to a third transition, which may, for instance, have an opposite direction compared to that of the second transition. This may allow the quantization circuit to evaluate even more different configurations and shapes of the pulse of the pulse width modulated signal allowing more different values to be encoded in a single pulse.

Additionally or alternatively, in a receiver according to an embodiment, the quantization circuit may be configured to determine the value based on either the third transition or the further intermediate transition further comprising the first signal level. This may allow the receiver circuit to return to its starting point to evaluate a new pulse of the pulse width modulated signal. The third transition or the further intermediate transition of the current pulse may then correspond to the first transition of the following pulse of the pulse width modulated signal. This may allow increasing the available bandwidth directly concatenating pulses and, for instance, by removing at least some synchronization structures or synchronization pulses from the signal.

Additionally or alternatively, the receiver may be configured to receive the pulse width modulated signal asynchronously. Additionally or alternatively, the receiver according to an embodiment may be a SENT-receiver and/or SPC-receiver (SENT=Single-Edge Nibble Transmission; SPC=Short PWM Codes; PWM=pulse width modulation). By implementing the receiver working asynchronously, it may be possible to simplify an implementation of a communication system comprising the receiver, since it may be possible to omit implementing a separate signal line or a similar infrastructure for a clock signal to be transmitted in parallel. Moreover, in the case of a SENT-receiver or a SPC-receiver, improving the previously-mentioned trade-off may be interesting since these receivers often operate under tough operating conditions including a large variety of different distortions.

Many of the previously-described options may also be implemented in the framework of a transmitter. For instance, also a transmitter according to an embodiment may operate asynchronously and, hence, may be configured to transmit the pulse width modulated signal asynchronously. Similarly, it may be a SENT-transmitter or a SPC-transmitter.

In terms of the signal shape, the transmitter circuit may be configured to generate the signal as described before in the context of the quantization circuit and the receiver circuit. For instance, in a transmitter according to an embodiment, the transmitter circuit may be configured to generate the signal to be constant at the intermediate signal or at a signal level between the intermediate signal level and the second signal level for at least a predetermined period of time immediately after the intermediate transition.

Additionally or alternatively, a receiver, a transmitter, a method for determining a value encoded in a pulse width modulated signal and a method for transmitting a value encoded in a pulse width modulated signal may be implemented based on durations the signal spends at or—with respect to a direction of a transition—beyond a specific signal level. In such an implementation, a receiver according to an embodiment comprises a receiver circuit to receive a pulse width modulated signal, the signal assuming at least a first signal level, a second signal level and an intermediate signal level between the first signal level and the second signal level. The receiver further comprises a quantization circuit to determine a value encoded in the signal based on an intermediate duration at a signal level equal to or along a direction on an intermediate transition beyond the intermediate signal level and on a main duration at a signal level equal to or along a direction of a second transition beyond a second signal level. The first transition comprises the first signal level, wherein the intermediate transition comprises the intermediate signal level, and wherein the second transition comprises the second signal level. Optionally, the intermediate transition may be located between the first transition and the second transition or the second transition may be located between the first transition and the intermediate transition.

A transmitter according to an embodiment comprises a quantization circuit to determine, based on a value, at least an intermediate duration and a main duration. The transmitter further comprises a transmitter circuit to generate a pulse width modulated signal, the signal assuming at least a first signal level, a second signal level and an intermediate signal level between the first signal level and the second signal level, wherein the signal comprises a signal level equal to or along a direction of an intermediate transition beyond the intermediate signal level for the intermediate duration and a signal level equal to or along a direction of a second transition beyond a second signal level for the main duration. The first transition comprises the first signal level, wherein the intermediate transition comprises the intermediate signal level, and wherein the second transition comprises the second signal level. Optionally, the intermediate transition may be located between the first transition and the second transition or the second transition may be located between the first transition and the intermediate transition.

A method according to an embodiment for determining a value encoded in a pulse width modulated signal comprises receiving the pulse width modulated signal, the signal assuming at least a first signal level, a second signal level and an intermediate signal level between the first signal level and the second signal level. The method further comprises determining the value encoded in the signal based on an intermediate duration and a signal level equal to or along a direction of an intermediate transition beyond the intermediate signal level and on a main duration at a signal level equal to or along a direction of a second transition beyond a second signal level. The first transition comprises the first signal level, wherein the intermediate transition comprises the intermediate signal level, and wherein the second transition comprises the second signal level. Optionally, the intermediate transition may be located between the first transition and the second transition or the second transition may be located between the first transition and the intermediate transition.

A method for transmitting a value encoded in a pulse width modulated signal comprises determining, based on the value to be transmitted, an intermediate duration and a main duration, and generating the pulse width modulated signal, the signal assuming at least a first signal level, a second signal level and an intermediate signal level between the first signal level and the second signal level. The signal comprises a signal level equal to or along a direction of an intermediate transition beyond the intermediate signal level for the intermediate duration and a signal level equal to or along a direction of the second transition beyond a second signal level for the main duration. The first transition comprises the first signal level, wherein the intermediate transition comprises the intermediate signal level, and wherein the second transition comprises the second signal level. Optionally, the intermediate transition may be located between the first transition and the second transition or the second transition may be located between the first transition and the intermediate transition.

Optionally, in a transmitter according to an embodiment, the transmitter circuit may be configured to generate the signal based on the intermediate duration to be constant at the intermediate signal level or at a signal level between the intermediate signal level and the second signal level for at least a predetermined period of time immediately after the intermediate transition. This may allow improving the previously-mentioned trade-off since it may be possible to limit an additional complexity of a transmitter circuit and yet increase the available bandwidth. Additionally or alternatively, it may also allow a robust transmission of a signal by maintaining the pulse-like shape of the signal.

For instance, in a transmitter according to an embodiment, additionally or alternatively the quantization circuit may be configured to determine the main time period and the intermediate time period based on the value using a quantization function, wherein the quantization function is based on a set of discrete time intervals, and wherein the transmitter circuit is configured to generate the signal such that the smallest time interval with respect to the intermediate time period of the set of discrete time intervals is larger than a maximum mismatch of the intermediate transition with respect to the first transition and such that the smallest time interval with respect to the main time period of the set of discrete time intervals is larger than a maximum mismatch of the second transition with respect to the first transition. This may allow the transmitter to generate the signal more reliably by limiting the allowable deviations of the transitions mentioned from their expected positions. The mismatches may be, for instance, deviations of the respective transitions with respect to the possible positions of the first transition. The maximum mismatch may be, for instance, defined in a predefined specification the transmitter complies with.

Moreover, embodiments also comprise a transceiver comprising a transmitter and a receiver as described before. In such a case, the transmitter circuit and the receiver circuit as well as the respective quantization circuits may share common components used for both, transmitting and receiving. Embodiments also comprise a computer program having a program code for performing any of the methods as described before, when the computer program is executed on a computer, a processor or another programmable hardware. Accordingly, an embodiment may also comprise both, a method for determining a value encoded in a pulse width modulated signal and a method for transmitting a value encoded in a pulse width modulated signal as described before. This also applies also to the computer program according to an embodiment.

Embodiments further comprise a communication system comprising a receiver and a transmitter, at least one of which is implemented according to an embodiment, as well as a vehicle like a car comprising a control unit comprising a receiver or a transceiver and at least one sensor comprising a transmitter or a transceiver, as described in the context of the communication system.

FIG. 1 shows a simplified block diagram of a communication system 100 according to an embodiment. The system 100 comprises an external component 110 and a receiver 120, which are coupled via a communication link 130. The communication link 130 may, for instance, comprise a bus for transmitting data at least in one direction. Naturally, in other embodiments the communication link 130 may comprise one or more individual data lines to allow data to be transmitted at least in one direction. Nevertheless, the communication link 130 may also be implemented to be capable of transmitting data in both direction such that the communication link 130 allowing to establish a bi-directional link or communication channel.

The communication system 100 may further comprise a transmitter 140, which may also be coupled to the communication link 130 to allow not only receiving data or values from the external component 110, but also sending or transmitting data or values to the external component 110. The receiver 120 and the transmitter 140 may, hence, be part of a transceiver 150 which in turn may comprise a multiplexer 160. During operation, the multiplexer 160 may, for instance, couple the receiver 120 or the transmitter 140 with the communication link 130 alternatively. Depending on the implementation of the transceiver 150 and the communication link 130, it may, however, by far not be necessary to implement a multiplexer 160. For instance, the communication link 130 may comprise individual signal lines for transmitting and receiving values on data for the transceiver 150.

Although in FIG. 1 the receiver 120 and the transmitter 140 are shown as being part of a larger entity, namely the transceiver 150, in other embodiments, the receiver 120 and the transmitter 140 may be implemented as separate entities or components. Irrespective of the question if a transceiver 150 is implemented or a separate transmitter 140 along with a separate receiver 120, the transmitter 140 and the receiver 120 may be part of a larger component, for instance, a sensor, an electronic control unit (ECU) or a similar component of a vehicle such as a car, a truck or another motorized or non-motorized vehicle, to name just a few examples. For instance, also the external component 110 may comprise, depending on the implementation, a receiver according to an embodiment and/or a transmitter according to an embodiment.

The receiver 120 comprises a receiver circuit 170, which is configured to receive a pulse width modulated signal assuming a first signal level, a second signal level and at least one intermediate signal level between the first signal level and the second signal level. Moreover, the receiver 120 comprises a quantization circuit 180, which is configured to determine a value encoded in the signal received by the receiver circuit 170. As will be laid out in context with FIGS. 2, 3 and 4 in more detail, the quantization circuit 180 may use, for instance, time periods between transitions or durations the signal spends in terms of a signal level at a specified signal level or—in view of a direction of a transition—beyond the respective signal level.

The transmitter 140 also comprises a quantization circuit 190, which is configured to determine, based on the value to be transmitted, one or more durations or time periods as will be laid out in more detail below. The transmitter 140 further comprises a transmitter circuit 200, which is configured to generate a pulse width modulated signal assuming the first signal level, the second signal level and at least one intermediate signal level to encode the value based on the durations and/or time periods determined by the quantization circuit 190 of the transmitter 140.

Although in FIG. 1 the transmitter 140 and the receiver 120 are shown to comprise distinct blocks for the receiver circuit 170, the quantization circuit 180, the quantization circuit 190 and the transmitter circuit 200, in a real-life implementation of a transceiver 150, the corresponding circuits may share at least partially components used, for instance, for processing and/or generating the respective signals.

Before, with respect to FIG. 2, an example of a signal is described, which may be generated by a transmitter according to an embodiment and received by a receiver 120 according to an embodiment, the SENT (Single-Edge Nibble Transmission) protocol as well as the SPC (Short PWM Code) protocol will be described first (PWM=Pulse Width Modulated). In both, the SENT-protocol as well as the SPC-protocol, a value comprising 4 bits or 16 (=$2^4$) different values can be transmitted by generating a pulse width modulated signal comprising a pulse. After a falling edge to a low signal level, a rising edge brings the signal level back to its original high value. A further falling edge brings the signal level back to the low signal level and concludes the pulse, which comprises the nibble. To be a little more specific, the nibble is encoded in a time duration between the falling edges. The quantization function used to convert the time period into the nibble and back is based on equidistant time intervals, wherein the smallest nibble value (0000=0) corresponds to 12 time intervals or ticks, while the largest nibble value (1111=15) corresponds to 27 time intervals or ticks. In other words, the quantization function used in the SENT-protocol and the SPC-protocol is based on an offset of 12 time intervals or ticks, to which the value of the nibble is added. In yet other words, the time period between the first and third transition T is equal to the sum of the offset of 12 ticks or time intervals plus the value of the nibble times 1 tick or time interval:

$T$=12 ticks+value of nibble·1 tick

Instead of the previously-described quantization function in other examples also more complex quantization functions may be used. For instance, according to the SENT-protocol, the maximum fall time is 6.5 µs, while the maximum rise time is 18.0 µs. The SENT-protocol therefore allows in the specified ranges an asymmetry with respect to the falling edges and the rising edges.

In a SENT-protocol and a SPC-protocol, the second falling edge of the pulse concludes the pulse. Nevertheless, the second falling edge of the previous pulse also represents the first falling edge of the pulse following immediately.

To allow a time basis to be established between the transmitter and the receiver, a synchronization frame will be sent having a specified length and structure, which allows the receiver to measure the actual length of the tick used by the transmitter.

In the SENT-protocol and the SPC-protocol the falling edges share a same direction. This may allow more accurate determination of the time period between the two transitions since variations between amplifier circuits or other components of a transmitter leading to asymmetries with respect to transitions having different directions may play a smaller role if any. In other examples and embodiments described below, the situation between falling edges and rising edges may be interchanged. Hence, the signal level arrangement as described in context of FIGS. 2, 3 and 4 is by far not required to be in this order.

Figure 2:
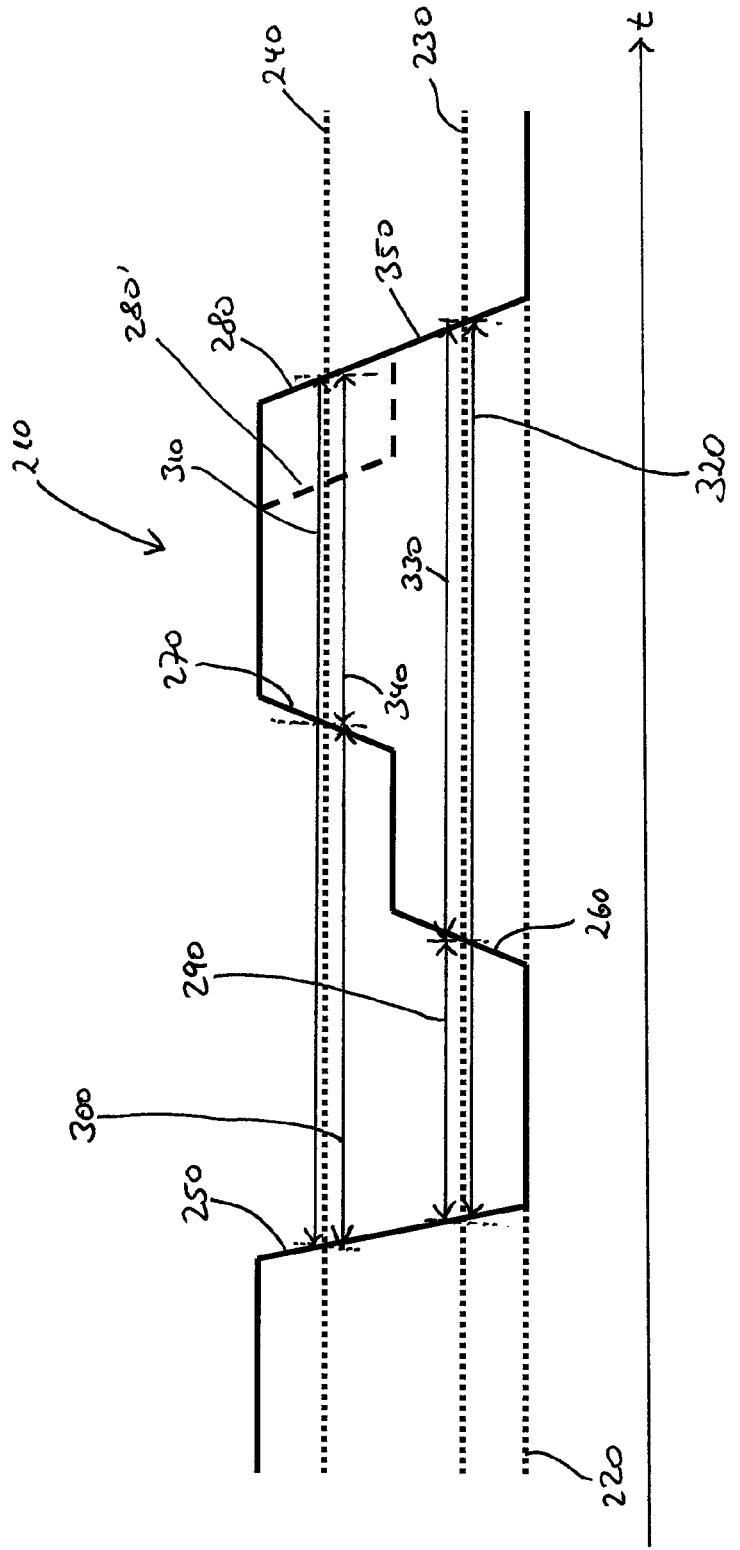
FIG. 2 illustrates a signal generated by transmitter according to an embodiment and processable by a receiver according to an embodiment.

FIG. 2 shows a simplified diagram of a signal, which may be generated by a transmitter 140 according to an embodiment and which may be received and processed by a receiver 120 according to an embodiment. The signal is a pulse width modulated signal comprising a pulse 210, which extends in the example depicted in FIG. 2 above a first signal level 220. However, as will be laid out in more detail below, the first signal level 220 is by far not required to be the lowest signal level. The roles of falling and rising edges can equally well be exchanged.

The signal is based further on an intermediate signal level 230 and a second signal level 240. The intermediate signal level 230 is, however, arranged in between the first and second signal levels 220, 240. While the first signal level 220 represents a base signal level, to which the signal returns, the second signal level 240 as well as the intermediate signal level 230 represent signal levels the signal typically crosses during its evolution, but which are not assumed for a longer period of time. In contrast, the basic signal level or first signal level 220 may very well be assumed for a noticeable period of time.

The signal evolves along a direction of time t as depicted in FIG. 2. In a first section, the signal is essentially constant at a signal level larger than the second signal level 240. After the constant section of the signal, the signal comprises a first transition 250 along a first direction, which corresponds to the direction of a falling edge in the example depicted in FIG. 2. During the first transition 250, the signal assumes in the specific order the second signal level 240, the intermediate signal level 230 and finally the first signal level 220, at which the signal remains constant. After a period of time, in which the signal is constant at the first signal level 220, an intermediate transition 260 causes the signal level to rise and to cross the intermediate signal level 230. In other words, during the intermediate transition 260, which is directed opposite to the first transition 250, the signal assumes the intermediate signal level 230 for a brief moment during its crossing. The signal then assumes a constant value for a period of time, before the signal changes into a second transition 270, which causes the signal level to cross the second signal level 240 and to assume a signal level higher than the second signal level. Once again, the signal remains constant until the signal goes over into a third transition 280, which causes the signal level to once again cross the second signal level 240.

As depicted by the solid line in FIG. 2, the third transition 280 of the signal causes the signal level further to cross the intermediate signal level 230 and to reach the first signal level 220 again, where a new pulse 210 may begin. In the case of the signal depicted by the solid line in FIG. 2, the third transition 280 of a pulse 210 may correspond to the first transition 250 of a pulse following the pulse 210 depicted in FIG. 2.

The quantization circuit 180 of the receiver 120 may now be able to determine the value encoded in the signal based on an intermediate time period 290 and the main time period 300. The intermediate time period 290 is the time period between the first transition 250 and the intermediate transition 260. To be a little more precise, in the example depicted in FIG. 2, the intermediate time period 290 is determined based on the moments of time, at which the signal crosses the intermediate signal level 230. However, in other examples and embodiments a different definition of the intermediate time period 290 may be chosen.

Similarly, the main time period 300 is the time period between the first transition 250 and the second transition 270. Once again, the main time period 300 is defined in the example depicted in FIG. 2 based on the signal crossing the second signal level 240.

The second transition 270 and the intermediate transition 260 share the same direction. In contrast, the first transition 250 has an opposite direction with respect to the second transition 270 and the intermediate transition 260.

Due to the intermediate signal level 230 being arranged in between the first signal level 220 and the second signal level 240 and the intermediate transition 260 having the same direction as the second transition 270, the signal is monotone after the first transition 250 until an end of the second transition 270. In other words, a slope of a signal is either non-negative or non-positive. In the example depicted here, the slope of the signal is non-negative or, in other words, equal to zero or positive. In the case of the second signal level 240 being smaller than the first signal level 220 causing the transitions 250, 260, 270 and 280 to be opposite, the slope of the signal would be non-positive or, in other words, equal to zero or negative. Short-time deviations, which may be caused by noise or the like, are not considered here.

In the example depicted here, the first transition does not only comprise the first signal level 220 but also the second signal level 240 and, as a consequence, also the intermediate signal level 230. This is, however, by far not necessary as will be laid out in more detail below. However, the intermediate transition comprises in the example depicted here also the first signal level 220 so that the intermediate transition 260 along with its intermediate signal level 230 represents the first step of the pulse 210.

To allow the quantization circuit 180 of the receiver 120 to determine the value more accurately, the main time period 300 as well as the intermediate time period 290 may use a quantization function which is based on a set of discrete time intervals or ticks. The smallest time interval or tick of the quantization function may be chosen to be larger than the length of the first transition 250, the intermediate transition 260 and the second transition. This may allow a more precise determination of the time period 290, 300.

Moreover, to increase the accuracy of the intermediate time period further, the quantization circuit 180 of the receiver 120 may be designed to determine the value based on the intermediate time period 290 only, when the signal is at least for a predetermined period of time constant after the intermediate transition 260 at the intermediate signal level 260 or—as shown in FIG. 2—at a signal level between the intermediate signal level 230 and the second signal level 240. In case of the previously-mentioned quantization function, the predetermined period of time may, for instance, correspond to at least the smallest time interval of the set of time intervals of the quantization function. This may allow the receiver 120 and its quantization circuit 180 to determine the presence of the intermediate signal level 230 even in a distortion-prone environment.

In embodiments of both a receiver 120 and a transmitter 140 according to embodiments, further parameters or further time periods may be used to determine or encode the value transmitted or to be transmitted. For instance, also, the position of the third transition 280 may be used. In other words, a quantization circuit 180 of the receiver 120 may, for instance, also consider a further main time period 310 to determine the value transmitted. Similarly, the quantization circuit 190 of the transmitter 140 may also determine the further main time period 310 and cause the transmitter circuit 200 to generate the signal accordingly. The further main time period 310 is the time period between the first transition 250 and the third transition 280. Once again, the further main time period 310 is determined by the signal crossing the corresponding signal level, here the second signal level 240. However, in other examples and embodiments a different strategy for determining the further main time period 310 may be used.

The quantization circuit 180 of the receiver 120 may further determine a further intermediate time period 320, which corresponds to the time period between the first transition 250 and a transition comprising the intermediate signal levels 230, which is located after the second transition 270 in the example depicted in FIG. 2. Here, the corresponding transition is the third transition 280.

In other words, the quantization circuit 180 of the receiver 120 may be capable of determining the value based on an intermediate duration 330 and a main duration 340. The main duration 340 is a duration the signal spends at a signal level equal to or above the second signal level 240. Accordingly, the intermediate duration 330 is the duration the signal spends at a signal level equal to or above the intermediate signal level 230.

However, since the order of the signal levels 220, 230 and 240 as depicted in FIG. 2 is by far not mandatory, in the case the first signal level 220 is located above the second signal level 240 with the intermediate signal level 230 arranged in between, the corresponding main duration 340 and the intermediate duration 330 correspond to the durations, the signal spends at a signal level equal to or below the second signal level 240 and the intermediate signal level 230, respectively. As a consequence, taking the direction of the second transition 270 and the direction of the intermediate transition 260 into account, the durations 330 and 340 may be defined, for example, based on the time the signal spends at the signal level equal to or along a direction of the intermediate transition 260 or the second transition 270, respectively, beyond the intermediate signal level 230 or the second signal level 240, respectively.

FIG. 2 further shows a slight modification of the signal, which is shown as a dashed line in FIG. 2. The dashed line signal deviates from the solid line signal after the second transition. This signal comprises a third transition 280', which is located before the third transition 280 of the signal shown in a solid line. The third transition 280' once again comprises the second signal level 240 so that the main duration 340 and the further main time period 310 are shortened accordingly. However, for the sake of simplicity, the shortened main duration 340 and the shortened further main time period 310 corresponding to the third transition 280' have been omitted in FIG. 2.

Following the third transition 280', the signal comprises a constant section, which crosses over into a further intermediate transition 350, which comprises the intermediate signal level 230 and also the first signal level 220 corresponding to the basic signal level of the signal. Hence, between the third transition 280' and the further intermediate transition 350 the dashed signal comprises a constant signal level between the intermediate signal level 230 and the second signal level 240.

A transmitter 140 as well as a receiver 120 may, for instance, be used in the framework of a SPC sensor interface employing a multilevel stair step modulation. In conventional SPC-protocols and SENT-protocols 4 bit nibbles are transmitted using a PWM encoding. Conventionally, the evaluation is only based on the falling edges of the pulses. This may lead to an undesirable limited data rate in both protocols. However, the standard SENT-protocols as well as the SPC-protocols have quite a long period in the nibble header, which is not used for data transmission. This gap may, for instance, be used to transmit additional information in the low phase of the SENT- or SPC-header. The increase of the data rate may be achieved by filling the gap in the nibble header with additional PWM-modulated information and data.

However, embodiments of a transmitter 140 as well as of a receiver 120 combine the pulse width modulation with an amplitude modulation and divide, for instance, a falling edge into several steps that can be performed consecutively to transmit multiple time information within a single nibble. As will be shown below with respect to FIGS. 3 and 4, the SENT standard as well as its extension based on SPC sensor interfaces capable of transmitting additional information in the low phase, can be extended by dividing the modulation step that is used to transmit the data into several separately controllable steps. Each step may deliver a time, which is a measure between two crossings of the associated signal levels or threshold levels. To illustrate this, FIG. 3 shows another example of a signal, which is based on a plurality of intermediate signal levels. To be a little more precise, the signal once again comprises a base signal line or a first signal line 220 and a second signal level 240. However, it also comprises a first intermediate signal level 230-1 and a second intermediate signal level 230-2. The two intermediate signal levels 230 are arranged in between the first and second signal levels 220, 240. The first intermediate signal level 230-1 is closer to the first signal level, while the second intermediate signal level 230-2 is closer to the second signal level 240.

After a first transition 250, which comprises all four signal levels 220, 230-1, 230-2, 240, the signal level remains constant for a period of time before the signal changes back to its original signal level being larger in the example depicted in FIG. 3 than the second signal level 240. In FIG. 3, this transition will be referred to as the third transition 280, although in the example depicted in FIG. 4, the corresponding transitions will be referred to differently.

After the third transition 280, the signal is once again constant at a signal level being larger than the second signal level 240 before the signal comprises the second transition 270, which corresponds to the main time period 300, which is also referred to in FIG. 3 as T3a. Afterwards, the signal is kept constant at a signal level between the second signal level and the second intermediate signal level 230-2 before it crosses over into a second intermediate transition 260-2 comprising the second intermediate signal level 230-2. The second intermediate transition 260-2 reduces the signal level to a signal level between the first and second intermediate signal levels 230-1, 230-2. Once again, the signal level of the signal will be kept constant before the signal crosses once again over into a first intermediate transition 260-1 comprising the first intermediate signal level 230-1. The first intermediate transition 260-1 brings the signal level back down to the first signal level 220.

Based on the two intermediate transitions 260-1, 260-2 and their associated intermediate signal levels 230-1, 230-2 as well as the first transition 250, the first and second intermediate time period 290-1 and 290-2 can be detected by the quantization circuit 180 of the receiver 120. The two intermediate time periods 290-1, 290-2 are also referred to as T1a and T2a, respectively, in FIG. 3.

The quantization function used for the signal in FIG. 3 is depicted by a plurality of parallel dotted lines 360. Each of the dotted lines corresponds to a predefined state or time interval, on the basis of which the quantization circuit 180 of the receiver 120 is capable of determining the value encoded in the pulse 210.

Naturally, the quantization circuit 190 and the transmitter circuit 200 of the transmitter 140 may use a similar strategy to generate the pulse width modulated signal depicted in FIG. 3.

FIG. 4 shows a similar signal as shown in FIG. 3, in which, however, the second transition 270 along with the intermediate transitions 260 no longer share the same direction. The situation depicted in FIG. 4 resembles more the situation depicted by the dashed line in FIG. 2. Similarly, the signal once again is based on a first signal level 220, which represents the basic signal level of the signal. Similar to the situation depicted in FIG. 3, the signal is based on a first intermediate signal level 230-1 and a second intermediate signal level 230-2 as well as a second signal level 240.

Similar to the situation depicted in FIG. 2, the signal comprises a first transition 250, which reduces the signal level from a signal level above the second signal level 240 to the first signal level 220 and, as a consequence, comprising—in this order—the second intermediate signal level 230-2 and the first intermediate signal level 230-1. After a small period of time, in which the signal level is constant, the first intermediate transition 260-1 raises the signal level above the first intermediate signal level 230-1, on the basis of which the first intermediate time period 290-1 (T1b) can be defined by the quantization circuit 180 of the receiver 120. After a short period of time, in which the signal level is once again constant at a level between the first and second intermediate signal levels 230-1, 230-2, the signal level is increased during the second intermediate transition 260-2 beyond the second intermediate signal level 230-2 but below the second signal level 240. Based on the second intermediate transition 260-2 the second intermediate time period 290-2 (T2b) can be defined. Afterwards the signal once again comprises for a small period time a constant signal level before the signal level is raised above the second signal level 240 in the framework of the second transition 270. Based on this, the main time period 300 (T3b) can equally well be defined.

Then, the signal comprises a constant signal level above the second signal level 240 until the third transition 280 sets in, which brings the signal level down between the second signal level 240 and the second intermediate signal level 230-2. After a small period of time, a second further intermediate transition 350-2 brings down the signal level below the second intermediate signal level 230-2, where the signal level is kept constant for a period of time before a first further intermediate transition 350-1 reduces the signal level below the first intermediate signal level 230-1 to the first signal level 220. Naturally, based on the further intermediate transitions 350 and the third transition 280, further intermediate time periods 320 can be determined, which are, however, for the sake of simplicity, not shown in FIG. 4. The third transition along with the two further intermediate transitions 350 may be used along with a quantization function represented by the dotted lines 360, while the positions of the intermediate transitions 260 and the second transition 270 may be used to determine the value based on the dotted lines 360' also representing the quantization function.

The extension of the code space with the increasing number of steps is given below for the example of a standard SPC pulse width modulated signal with 4 bit data encoded in 0 to 15 tick time variations of the pulse duration between the two falling edges 250 and the transitions 280, 350-2, 350-1. In the case of a single standard step 16 (=$2^4$) values can be encoded. By using two steps, the data rate may be increased by three additional bits. To be more precise, by using two steps, it may be possible to transmit 136 different states, which is more than 128 (=$2^7$) states. Adding a third step adds another two bits. Based on three steps, an overall number of 812 or 816 different states may be encodable. This is, however, larger than 512 (=$2^9$).

To summarize, using a single step may allow to transmit 16 different states (N=$2^4$=16):

$$\sum_{n0=1}^{N} 1 = 16.$$

By using two steps, the total number increases to $$\sum_{n0=1}^{N} \sum_{n1=n0}^{N} 1 = 136.$$

By using three steps, the number increases further to $$\sum_{n0=1}^{N} \sum_{n1=n0}^{N} \sum_{n2=n1}^{N} 1 = 816.$$

By using four steps, the total number increases to $$\sum_{n0=1}^{N} \sum_{n1=n0}^{N} \sum_{n2=n1}^{N} \sum_{n3=n2}^{N} 1 = 3.876 \cdot 10^3.$$

By using five steps, the number increases to $$\sum_{n0=1}^{N} \sum_{n1=n0}^{N} \sum_{n2=n1}^{N} \sum_{n3=n2}^{N} \sum_{n4=n3}^{N} 1 = 1.55 \cdot 10^4.$$

Embodiments may extend the available code space. In other words, the number of states can be increased by combining the number of states of different steps. As illustrated by the above equations, the number of steps of a higher order—indicated by the range of index n1 compared to the range of index n0, indicated by the range of index n2 compared to the range of index n1, etc.—cannot be larger than the number of steps of a lower order. The total number of states can then be distributed to the total number of bit sequences to be transmitted or received.

For instance, in the case of a basic transmission scheme capable of transmitting or receiving a nibble (4 bits, 16 states) corresponding to a maximum of 16 ticks, by introducing the additional intermediate signal level 136 states can be assumed allowing 7 bits (128 states) instead of 4 bits (16 states) to be encoded. In terms of allocating the different signal levels to the states, in contrast to a conventional PWM signal with a fixed overall length of a pulse or fixed duration, the number of ticks of a higher order depends on the number of ticks of the lower order or lower orders.

To illustrate this, in the case of a two-step signal, having a single tick at the lower order leads only to a single tick at the higher order. In contrast, when the signal has a duration of 16 ticks of the lower order, the duration of the higher order may be any number of ticks from 1 to 16. Hence, in this embodiment no value of any bit sequence of the information encoded in the PWM signal can be determined based on the number of ticks of the lower order alone. For the received PWM signal, each bit value extracted from the PWM signal depends on the determined time durations from all levels. To illustrate this further, having 16 ticks of the lower order, only 8 ticks are needed to encode the 3 additional bits. The binary state 1111xxx can be encoded by the 16 ticks of the lower level, but only 8 ticks are needed to encode the 3 undetermined bits indicated above by "x". Hence, in this example, the 8 additional ticks possible apart from the 8 ticks needed to encode the 3 undetermined bits may be used to encode another bit sequence different from the previously mentioned bit sequence 1111xxx. In other words, the 16 ticks of the lower order do not determine the first 4 bits (1111 in the example given) of the bit sequence. This evaluation requires knowledge of the higher order.

The above described scheme can be regarded as a mapping of the bit sequence represented by the PWM signal to a constellation vector in an n-dimensional constellation space, where n corresponds to the number of signal levels (e.g. number of intermediate levels +1). The complete data bit information which is to be encoded in the PWM signal corresponds to a data bit sequence of n bits which is then mapped to a constellation vector. Each constellation vector corresponds to one of the possible PWM signals, i.e. to a specific main time period and specific intermediate time periods. Thus, for encoding the data bit information, the time period of the first signal level is always determined based on all n bits of the complete data bit information and also the time period of all intermediate signal levels is determined based on all n bits of the data bit information. Likewise, at the receiver, in order to determine each of the n bits, a measured time interval of the first signal level and measured time interval of all intermediate signal levels is required.

Hence, embodiments may implement a code space expansion compared to the basis transmission protocol rather than a multiplexing of independent values. For instance, the discrete time intervals of the set of discrete time intervals of the quantization function may be equally spaced or being equidistant. To emphasize this, a single quantization function is used for both, the intermediate time period and the main time period, may be used.

Although the situation has been described mainly with respect to the receiver 120, the same is also true for the transmitter 140 and its quantization circuit 190 and its transmitter circuit 200. Similarly, also a transceiver 150 comprising a receiver 120 and a transmitter 140 and a communication system 100 comprising at least one receiver and at least one transmitter 140 according to one embodiment may be used accordingly.

However, an alternative to using a transmitter 140 and a receiver 120 according to an embodiment may be to use shorter bit times to increase the data rate. While this may leave the emission spectrum of the signal almost unchanged, the emitted energy may have to be increased in the case of shorter bit times to ensure a robust transmission. This may, however, lead on the receiver side to problems that additional detection levels may have to be required and a more complex receiver infrastructure may have to be used.

Figure 5:
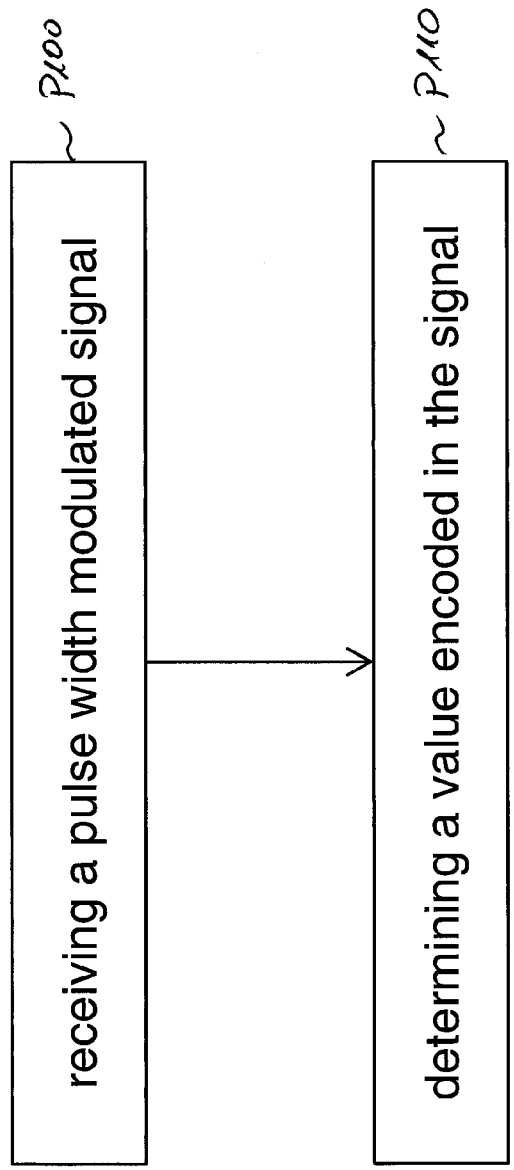
FIG. 5 shows a flowchart of a method according to an embodiment for determining a value encoded in a pulse width modulated signal.

FIG. 5 finally shows a flowchart of a method for determining a value encoded in a pulse width modulated signal. In a process P100 of receiving the pulse width modulated signal, the value encoded in the signal may be determined in a process P110. The determination of the value encoded in the signal may be implemented as described before.

Figure 6:
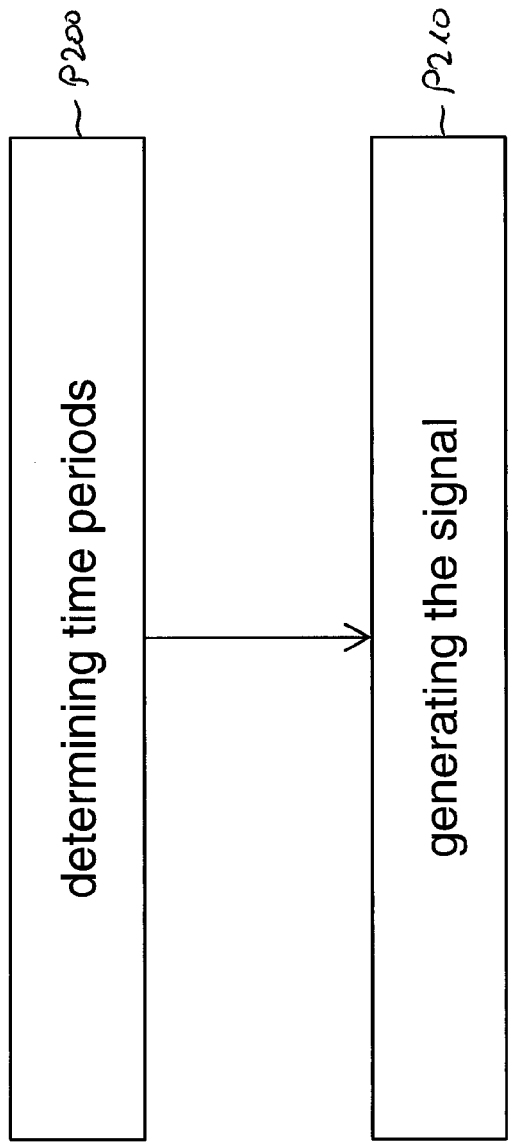
FIG. 6 shows a flowchart of a method according to an embodiment for transmitting a value encoded in a pulse width modulated signal.

FIG. 6 shows a flowchart of a method according to an embodiment for transmitting a value to be encoded in a pulse width modulated signal. In a process P200 the time periods may be determined on the basis of which in a process P210 the signal may then be generated.

Figure 7:
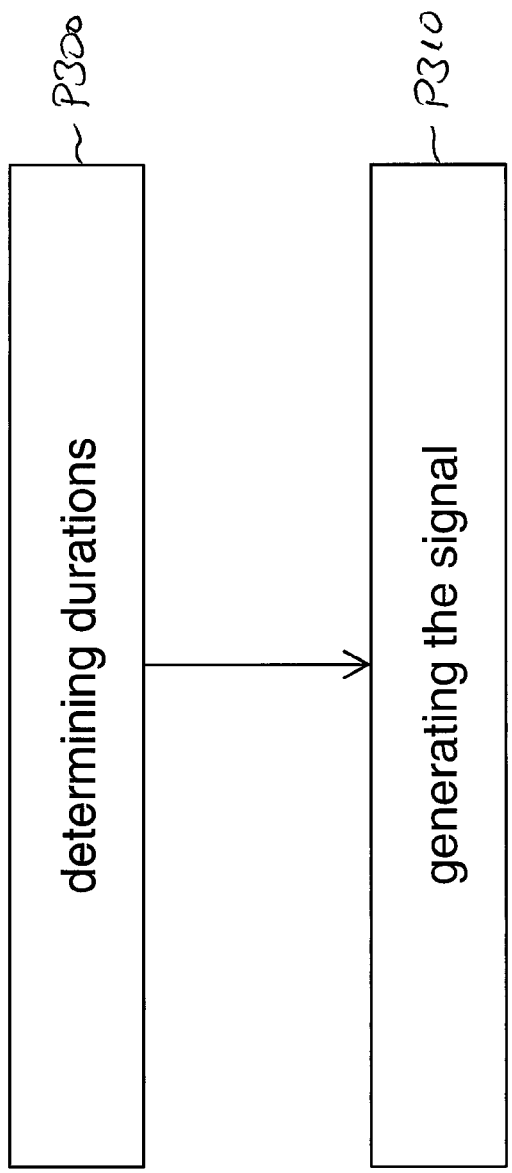
FIG. 7 shows a flowchart of a further method according to an embodiment for transmitting a value encoded in a pulse width modulated signal.

Finally, in FIG. 7 a flowchart is shown for another method according to an embodiment for transmitting a value to be encoded in a pulse width modulated signal. In a process P300 the durations may be determined, which are then used in a process P310 of generating the corresponding signal.

The order of the processes is by far not restricted to the order depicted in the figures or the description. The order of execution of the processes may differ in embodiments. Moreover, the processes may be executed overlapping in time or even simultaneously. They may also be repeated and, for instance, be executed in a loop, until a specified condition is fulfilled.

The downward compatibility with protocols such as SENT or SPC may be sacrificed. However, it may also be possible to implement an embodiment of a transmitter 140 or a transceiver 150, which may generate a signal, which may be received and processed by a conventional receiver. Such a conventional receiver may eventually not be capable of fully extracting the value, but may extract only a part of this or a different value. But even this may be acceptable in some applications.

Naturally, as outlined before, embodiments may also comprise a computer program having a program code for performing any of the method described, when the computer program is executed on a computer, a processor or another programmable hardware. Such a programmable hardware may, for instance, comprise a controller for a car, but also a sensor or another device.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

Functional blocks denoted as "means for . . . " (performing a certain function) shall be understood as functional blocks comprising circuitry that is configured for performing or to perform a certain function, respectively. Hence, a "means for s.th." may as well be understood as a "means being configured or suited for s.th.". A means being configured for performing a certain function does, hence, not imply that such means necessarily is performing said function (at a given time instant).

The methods described herein may be implemented as software, for instance, as a computer program. The sub-processes may be performed by such a program by, for instance, writing into a memory location. Similarly, reading or receiving data may be performed by reading from the same or another memory location. A memory location may be a register or another memory of an appropriate hardware. The functions of the various elements shown in the Figures, including any functional blocks labeled as "means", "means for forming", "means for determining" etc., may be provided through the use of dedicated hardware, such as "a former", "a determiner", etc. as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included. Similarly, any switches shown in the Figures are conceptual only. Their function may be carried out through the operation of program logic, through dedicated logic, through the interaction of program control and dedicated logic, the particular technique being selectable by the implementer as more specifically understood from the context.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes, which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective processes of these methods.

Further, it is to be understood that the disclosure of multiple processes or functions disclosed in the specification or claims may not be construed as to be within the specific order. Therefore, the disclosure of multiple processes or functions will not limit these to a particular order unless such processes or functions are not interchangeable for technical reasons.

Furthermore, in some embodiments a single process may include or may be broken into multiple sub-processes. Such sub-processes may be included and part of the disclosure of this single process unless explicitly excluded.

What is claimed is:

1. A receiver comprising:
a receiver circuit configured to receive a pulse width modulated signal, the signal assuming at least a first signal level, a second signal level and an intermediate signal level between the first signal level and the second signal level; and
a quantization circuit configured to determine a value encoded in the signal based on an intermediate time period between a first transition and an intermediate transition and based on a main time period between the first transition and a second transition, the first transition and the second transition having the same direction, wherein the first transition comprises the first signal level, wherein the intermediate transition comprises the intermediate signal level, and wherein the second transition comprises the second signal level;
wherein the receiver circuit is configured to receive the pulse width modulated signal assuming a plurality of intermediate signal levels between the first signal level and the second signal level, the plurality of intermediate signal levels comprising the intermediate signal level, wherein the quantization circuit is configured to determine the value encoded in the signal based on the main time period and on a plurality of intermediate time periods between the first transition and a plurality of intermediate transitions, and wherein each of the plurality of intermediate transitions comprises a different intermediate signal level of the plurality of intermediate signal levels, and wherein the plurality of intermediate signal levels are located between the first signal level and the second signal level.

2. The receiver according to claim 1, wherein the quantization circuit is configured to determine the value based on the second transition and the intermediate transition having the same direction.

3. The receiver according to claim 1, wherein the quantization circuit is configured to determine the value based on the signal being monotone after the first transition until an end of the second transition.

4. The receiver according to claim 1, wherein the quantization circuit is configured to determine the value based on the intermediate transition further comprising the first signal level.

5. The receiver according to claim 1, wherein the quantization circuit is configured to determine the value based on the first transition further comprising the second signal level.

6. The receiver according to claim 1, wherein the quantization circuit is configured to determine the main time period based on the signal crossing the second signal level and the intermediate time period based on the signal crossing the intermediate signal level.

7. The receiver according to claim 1, wherein the quantization circuit is configured to determine the value based on the main time period and the intermediate time period using a quantization function, wherein the quantization function is based on a set of discrete time intervals, wherein the smallest time interval with respect to the intermediate time period of the set of discrete time intervals is larger than a maximum mismatch of the intermediate transition with respect to the first transition, and wherein the smallest time interval with respect to the main time period of the set of discrete time intervals is larger than a maximum mismatch of the second transition with respect to the first transition.

8. The receiver according to claim 1, wherein the quantization circuit is configured to determine the value encoded in the signal further based on a further intermediate time period between the first transition and a further intermediate transition and based on a further main time period between the first transition and a third transition, wherein the third transition comprises the second signal level, wherein the further intermediate transition comprises the intermediate signal level, and wherein the third transition is located between the second transition and the further intermediate transition.

9. The receiver according to claim 8, wherein the quantization circuit is configured to determine the value based on the further intermediate transition further comprising the first signal level.

10. The receiver according to claim 1, wherein the receiver is at least one of a receiver configured to receive the pulse width modulated signal asynchronously, a single-edge nibble transmission (SENT)-receiver and a short PWM codes (SPC)-receiver.

11. A transmitter comprising:
a quantization circuit configured to determine, based on a value to be encoded in a pulse width modulated signal, an intermediate time period between a first transition and an intermediate transition and a main time period between the first transition and a second transition, the first transition and the second transition having the same direction; and
a transmitter circuit configured to generate the pulse width modulated signal, the signal assuming at least a first signal level, a second signal level and an intermediate signal level between the first signal level and the second signal level, wherein the first transition comprises the first signal level, wherein the intermediate transition comprises the intermediate signal level, and wherein the second transition comprises the second signal level;
wherein the transmitter circuit is configured to transmit the pulse width modulated signal assuming a plurality of intermediate signal levels between the first signal level and the second signal level, the plurality of intermediate signal levels comprising the intermediate signal level, wherein the quantization circuit is configured to determine the value encoded in the signal based on the main time period and on a plurality of intermediate time periods between the first transition and a plurality of intermediate transitions, and wherein each of the plurality of intermediate transitions comprises a different intermediate signal level of the plurality of intermediate signal levels, and wherein the plurality of intermediate signal levels are located between the first signal level and the second signal level.

12. The transmitter according to claim 11, wherein the transmitter circuit is configured to generate the signal to be constant at the intermediate signal level or at a signal level between the intermediate signal level and the second signal level for at least a predetermined period of time immediately after the intermediate transition.

13. The transmitter according to claim 11, wherein the quantization circuit is configured to determine the main time period and the intermediate time period based on the value using a quantization function, wherein the quantization function is based on a set of discrete time intervals, and wherein the transmitter circuit is configured to generate the signal such that the smallest time interval with respect to the intermediate time period of the set of discrete time intervals is larger than a maximum mismatch of the intermediate transition with respect to the first transition and such that the smallest time interval with respect to the main time period of the set of discrete time intervals is larger than a maximum mismatch of the second transition with respect to the first transition.

14. The transmitter according to claim 11, wherein the transmitter is at least one of a transmitter configured to generate the pulse width modulated signal asynchronously, a single-edge nibble transmission (SENT)-transmitter and a short PWM codes (SPC)-transmitter.

15. The transmitter according to claim 11, wherein a complete data bit information to be transferred by the pulse width modulated signal corresponds to a data sequence, wherein the quantization circuit determines the intermediate time period depending on all bits of the data sequence and wherein the quantization circuit determines the main time period depending on all bits of the data sequence.

16. A communication system comprising a receiver and a transmitter,
   wherein the receiver comprises a receiver circuit to receive a pulse width modulated signal, the signal assuming at least a first signal level, a second signal level and an intermediate signal level between the first signal level and the second signal level; and
   a quantization circuit to determine a value encoded in the signal based on an intermediate time period between a first transition and an intermediate transition and based on a main time period between the first transition and a second transition, the first transition and the second transition having the same direction, wherein the first transition comprises the first signal level, wherein the intermediate transition comprises the intermediate signal level, and wherein the second transition comprises the second signal level;
   wherein the transmitter comprises a quantization circuit to determine, based on a value to be encoded in the pulse width modulated signal, the intermediate time period between the first transition and the intermediate transition and the main time period between the first transition and the second transition; and a transmitter circuit to generate the pulse width modulated signal, the signal assuming at least the first signal level, the second signal level and the intermediate signal level between the first signal level and the second signal level, wherein the first transition comprises the first signal level, wherein the intermediate transition comprises the intermediate signal level, and wherein the second transition comprises the second signal level;
   wherein the receiver circuit is configured to receive the pulse width modulated signal assuming a plurality of intermediate signal levels between the first signal level and the second signal level, the plurality of intermediate signal levels comprising the intermediate signal level, wherein the quantization circuit is configured to determine the value encoded in the signal based on the main time period and on a plurality of intermediate time periods between the first transition and a plurality of intermediate transitions, and wherein each of the plurality of intermediate transitions comprises a different intermediate signal level of the plurality of intermediate signal levels, and wherein the plurality of intermediate signal levels are located between the first signal level and the second signal level.

* * * * *